(12) United States Patent
Bangert

(10) Patent No.: US 7,719,881 B2
(45) Date of Patent: May 18, 2010

(54) RECONFIGURABLE DIGITAL LOGIC UNIT

(75) Inventor: Joachim Bangert, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 619 days.

(21) Appl. No.: 10/592,539

(22) PCT Filed: Mar. 7, 2005

(86) PCT No.: PCT/EP2005/051000

§ 371 (c)(1),
(2), (4) Date: Nov. 14, 2006

(87) PCT Pub. No.: WO2005/091504

PCT Pub. Date: Sep. 29, 2005

(65) Prior Publication Data

US 2007/0194806 A1   Aug. 23, 2007

(30) Foreign Application Priority Data

Mar. 15, 2004   (DE) ............. 10 2004 012 531

(51) Int. Cl.
G11C 11/00   (2006.01)

(52) U.S. Cl. .......... 365/158; 326/37; 326/104; 365/171; 365/173

(58) Field of Classification Search ........... 326/38, 326/47, 37, 104; 365/158, 171, 173
See application file for complete search history.

(56) References Cited

U.S. PATENT DOCUMENTS 6,140,838 A * 10/2000 Johnson ............... 326/39
6,894,921 B2 * 5/2005 Bangert ............... 365/158
7,355,439 B2 * 4/2008 Bangert et al. .......... 326/38
7,397,285 B2 * 7/2008 Agan et al. ............ 326/104
7,400,176 B2 * 7/2008 Agan et al. ............ 326/104
2006/0164124 A1 * 7/2006 Koch et al. ............ 326/104

FOREIGN PATENT DOCUMENTS

| DE | 199 22 129 | 9/2000 |
|----|------------|--------|
| DE | 1 052 778 | 11/2000 |
| DE | 102 37 876 | 3/2003 |
| JP | 9-74183 | 3/1997 |

(Continued)

OTHER PUBLICATIONS

Richter et al., "Field programmable spin-logic based on magnetic tunnelling elements," 2002, Journal of Magnetism and Magnetic Materials 240. pp. 127-129.*

(Continued)

Primary Examiner—Anh Phung
Assistant Examiner—Alexander Sofocleous
(74) Attorney, Agent, or Firm—Young & Thompson

(57) ABSTRACT

The invention relates to a reconfigurable digital logic unit comprising at least one logic gate with a cell presenting a magnetic layer system, the resistance of which may be altered by means of magnetic field pulses. Said logic gate comprises at least one first leg with at least one data cell and a second leg, wired parallel to the above, with at least one reference cell and a means for determination of the resistances of the first and second legs, representing a measure of the logical state of the logic gate, whereby the first leg comprises at least two parallel data cells (2).

21 Claims, 2 Drawing Sheets

FOREIGN PATENT DOCUMENTS

| JP | 9-320257 | 12/1997 |
|---|---|---|
| JP | 2004-6775 | 1/2004 |
| WO | WO 03026131 A2 * | 3/2003 |

OTHER PUBLICATIONS

Wang et al., "70% TMR at Room Temperature for SDT Sandwich Junctions With CoFeB as Free and Reference Layers," Jul. 2004, IEEE Transactions on Magnetics, vol. 40, No. 4. pp. 2269-2271.*

Hassoun et al., "Field Programmable Logic Gates Using GMR Devices," Sep. 1997, IEEE Transactions on Magnetics vol. 33, No. 5. pp. 3307-3309.*

Black, Jr. et al., "Programmable logic using giant-magnetoresistance and spin-dependent tunneling devices," May 2000, Journal of Applied Physics, vol. 87, No. 9. pp. 6674-6679.*

Richter et al., "Nonvolatile field programmable spin-logic for reconfigurable computing," Feb. 2002, Applied Physics Letters vol. 80, No. 7. pp. 1291-1293.*

Richter et al., "Field programmable spin-logic realized with tunnelling-magnetoresistance devices," 2002, Solid States Eletronics 46. pp. 639-643.*

* cited by examiner

RECONFIGURABLE DIGITAL LOGIC UNIT

CROSS-REFERENCE TO RELATED APPLICATIONS

This application is a 371 of PCT/EP05/51000.

BACKGROUND OF THE INVENTION

The invention relates to a reconfigurable digital logic unit comprising at least one logic gate with cells which have a magnetic layer system and the resistance of which can be altered by means of magnetic field pulses, which logic gate comprises at least one first line branch with at least one data cell and a second line branch—connected in parallel therewith—with at least one reference cell, and also a means for evaluating the resistances of the first and second line branches, said resistances representing a measure of the logic state of the logic gate.

Cells of this type make it possible to store items of information on a magnetic basis. The magnetization of a layer of the magnetic layer system can be changed by means of a magnetic field pulse, so that the magnetoresistance of this layer structure changes by a few per cent. The respective resistance can be read out and is a measure of the logic state of the cell.

However, the application possibilities for digital logic units of this type have been greatly restricted heretofore. One of the practical problems is that the TMR resistance (tunneling magnetoresistive) primarily depends on the current direction chosen. This is possibly caused by different materials on the two barrier sides.

DE 199 22 129 C1 describes a device for logically combining signals on a magnetoresistive basis. In this case, input signals present at inputs are combined to form fixed output signals present at one or a plurality of outputs. This involves fixed, invariable circuits which are neither reprogrammable nor reconfigurable.

A so-called analog reference cell is described in DE 102 37 876 A1. An analog reference cell is a component which supplies a certain standard resistance after the setting by corresponding means. The analog reference cell thus forms a component of a logic reference cell which can store a signal and can be set by means of a configuration signal.

SUMMARY OF THE INVENTION

Therefore, the invention is based on the problem of providing a reconfigurable digital logic unit in which the read current direction is identical for all of the cells.

In order to solve this problem, in the case of a reconfigurable digital logic unit of the type mentioned in the introduction, the invention provides for the first line branch to have at least two data cells connected in parallel.

The first line branch of the logic gate of the reconfigurable digital logic unit according to the invention comprises at least one data cell which can be programmed by means of magnetic field pulses in that the resistance of the data cell can be changed by application of magnetic field pulses. The difference between the two states that can be set is referred to as the TMR signal swing. The reference cell arranged in the parallel, second line branch is likewise a TMR cell with a magnetic layer system. The reference cell may be a preprogrammed cell, but a reprogrammable cell may also be involved. In both cases, the respective programming is maintained in nonvolatile fashion and determines the function of the logic gate. A means for evaluating the resistances of the first and second line branches is provided according to the invention. Said resistances are a measure of the logic state of the logic gate.

The means for evaluating the resistances of the first and second line branches may be formed as a comparator, as depicted schematically in FIG. 1. In this case, the resistances of the two line branches are evaluated individually.

As an alternative, in the case of the logic unit according to the invention, it may be provided that the means is formed as a parallel circuit comprising the first and second line branches and the total resistance of the parallel circuit can be evaluated, as depicted schematically in FIG. 1. In this variant of the invention, the resistances are evaluated jointly. The parallel circuit has the effect that the reference cells influence the TMR signal swing of the logic gate.

In accordance with one development of the reconfigurable digital logic unit according to the invention, it may be provided that the second line branch has at least two reference cells connected in parallel. The parallel-connected cells of each line branch may be separately programmable, which results in further application possibilities. It is not necessary for the number of cells in the first line branch to match the number of cells in the second line branch, rather the two line branches may have a different number of cells.

In accordance with one development of the invention, the first line branch may have a plurality of data cells connected in series and the second line branch may have a plurality of reference cells connected in series. In this case, it is particularly preferred for a reference cell to be assigned to each data cell connected in series.

In a particularly advantageous manner, the output of a logic gate may be connected or be able to be connected to a further gate in order to drive the latter. Unlike in the case of logic gates with magnetic layer systems that are known in the prior art, the current in the case of the digital logic unit according to the invention possibly suffices to drive a further gate since the total resistance of the parallel circuit is always less than the least of the resistances.

A further advantage of the logic unit according to the invention can be seen in the fact that the cells of the logic gate have the same read current direction. This avoids the disadvantage of the current flowing through TMR cells in different directions, which can lead to problems in the signal assessment.

In the case of the logic unit according to the invention, it is particularly preferred for the resistance of a cell to be able to be altered by up to approximately 60% by means of magnetic field pulses.

In a further refinement of the invention, the two parallel resistances of the first line branch may approximately match, with the result that a three-value logic is created. The three-value logic has the states true, false and indifferent. In the case of three-value logic, it is particularly preferred for the resistance change for the third state to lie between low (0%) and high (e.g. 60%). A logic gate of this type may be used for the gate functions NOR, NAND, OR, AND, const.

In a further refinement of the invention, one of the resistances of the first line branch may approximately amount to 5/3 of the other resistance. A four-value logic comprising the resistance levels high, medium-high, medium-low, low is created in this case. A logic gate of this type may be used for the gate functions OR, var, AND, const., NOR, NAND.

The reconfigurable digital logic unit according to the invention may comprise logic gates in two-value and/or three-value and/or four-value logic.

The logic unit may be formed as a field-programmable logic unit, but as an alternative it is also possible for said logic unit to be formed as a mask-programmable logic unit.

BRIEF DESCRIPTION OF THE DRAWINGS

Further advantages and units of the invention emerge from the exemplary embodiment described below with reference to the drawings, in which.

DETAILED DESCRIPTION OF THE PREFERRED EMBODIMENT

Figure 1:
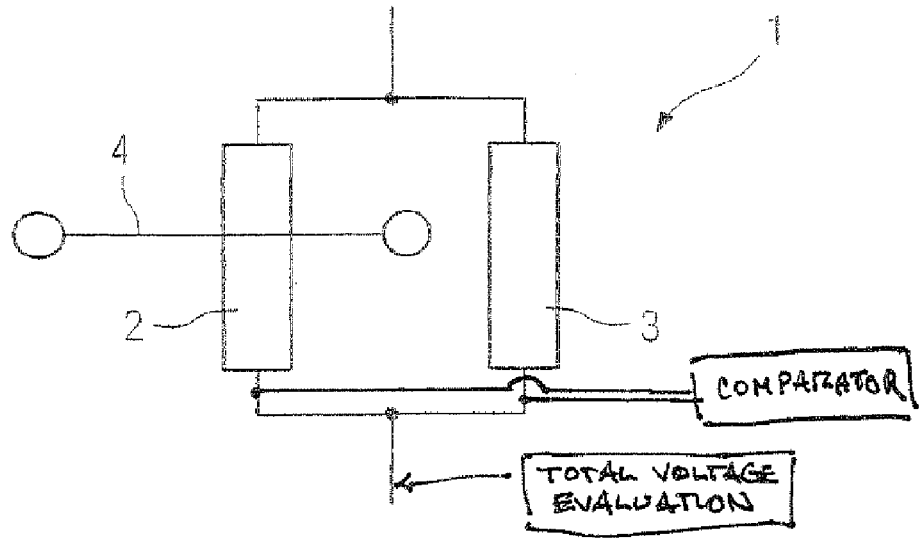
FIG. 1 shows a logic unit according to the invention comprising a data cell and a reference cell in parallel therewith.

The logic unit 1 shown in FIG. 1 comprises a data cell 2 and a reference cell 3 connected in parallel therewith. The cells 2, 3 each have a magnetic layer system whose magnetization can be changed over between two states by means of an applied magnetic field. The two states can be interpreted as an information bit and represent the logic states 0 and 1 or low and high. The magnetoresistance changes depending on these states in the percentage range, so that the resistance change can be used for reading out items of information stored in the cell.

The data cell 2 can be programmed by means of a magnetic field pulse applied to the input line 4. The programmed cell 3 may be either reprogrammable or a constant reference cell. The programming is maintained in nonvolatile fashion and determines the functions of the logic gate.

The two cells can be changed over from their minimum resistance R1 and R2, respectively, to a higher resistance value by the TMR signal swing m. This results in four different combinations, the total resistance of which can be calculated as follows:

minimum resistance (R1=low/R2=low)

$$Rtot = \frac{R1 \cdot R2}{R1 + R2}$$

intermediate state 1 (R1=low/R2=high)

$$Rtot = \frac{R1 \cdot (1+m) \cdot R2}{R1 \cdot (1+m) + R2}$$

intermediate state 2 (R1=high/R2=low)

$$Rtot = \frac{R1 \cdot R2 \cdot (1+m)}{R1 + R2 \cdot (1+m)}$$

maximum resistance (R1=high/R2=high)

$$Rtot = \frac{R1 \cdot R2}{R1 + R2} \cdot (1+m)$$

If both gates are programmed with the same current (low/low or high/high), this does not result in an externally measurable change in the TMR signal swing, but rather only a halving of the total resistance. However, additional functionalities arise as a result of the intermediate levels.

In the simplest case, if R2=R1 is chosen, identical resistance levels arise. These states are of importance particularly in the case of three-value logic with the states true, false and indifferent.

Figure 2:
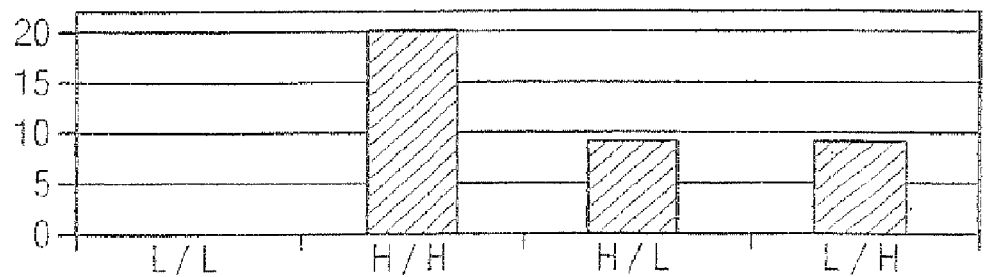
FIG. 2 shows a diagram of the TMR signal swing for the different states of the cells in the case of three-value logic.

FIG. 2 shows a diagram of the TMR signal swing for the different states of the cells as a function of the resistances. The respective combinations of the resistances R1 and R2 are illustrated on the x axis. The percentage TMR signal swing as a function of the resistances is illustrated on the y axis. The maximum value, which arises in the case of the state H/H, corresponds to a TMR signal swing of 20%. The TMR signal swing is the rise or increase by which the resistance can be raised proceeding from the minimum resistance, e.g. R1.

The signal swing of the intermediate levels amounts to 9.1% in this case. In this way, the logic unit can be used for three-value logic.

Figure 3:
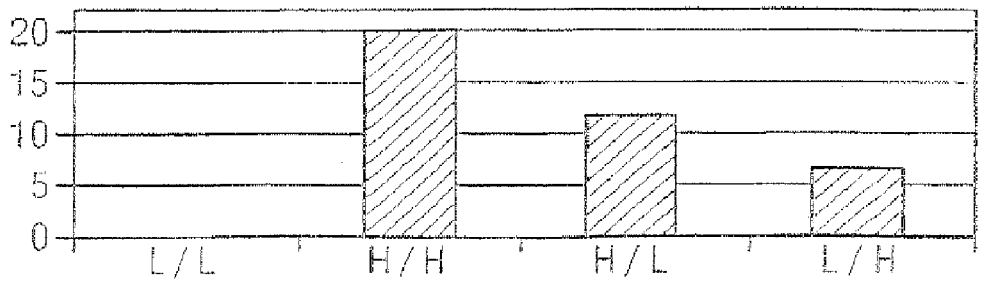
FIG. 3 shows a diagram of the TMR signal swing in the case of four-value logic.

FIG. 3 is a diagram of the TMR signal swing in the case of four-value logic.

In this case, the resistances R1 and R2 can be chosen so as to form four levels in the TMR signal swing which are spaced apart identically with respect to one another. This is achieved in the case of R2=1.667 R1 or R2=5/3 R1. Unlike in the diagram of FIG. 2, the intermediate levels H/L and L/H now differ from one another.

New functions arise as a result of the combinations of the conventional (two-value), three-value and four-value logic on a chip. For this purpose, in each case a plurality of function gates and a plurality of programming gates can be connected in parallel. It is not necessary for the same TMR signal swing to be present in each case. Likewise, the sheet resistance is not of crucial significance since the properties can be set by way of the area of the individual cells.

The logic unit shown in FIG. 1 and corresponding circuits can be realized particularly well with field-programmable logic; as an alternative, the field-programmable logic may also be combined with the mask-programmable logic by omitting data or reference cells as required.

In principle, the arrangement of the cells through which the same current is intended to flow for determining the resistance may be embodied as an arrangement of individual cells one alongside another, but also one above another, if a layer system with a plurality of identical functional layers is present.

Instead of using a single cell, it is possible for a plurality of cells to be connected in parallel in order to form an average value of the resistances. In this case, the programming or data current is identical for all of the cells. The cell resistance is maintained independently of the series or parallel circuit.

Figure 4:
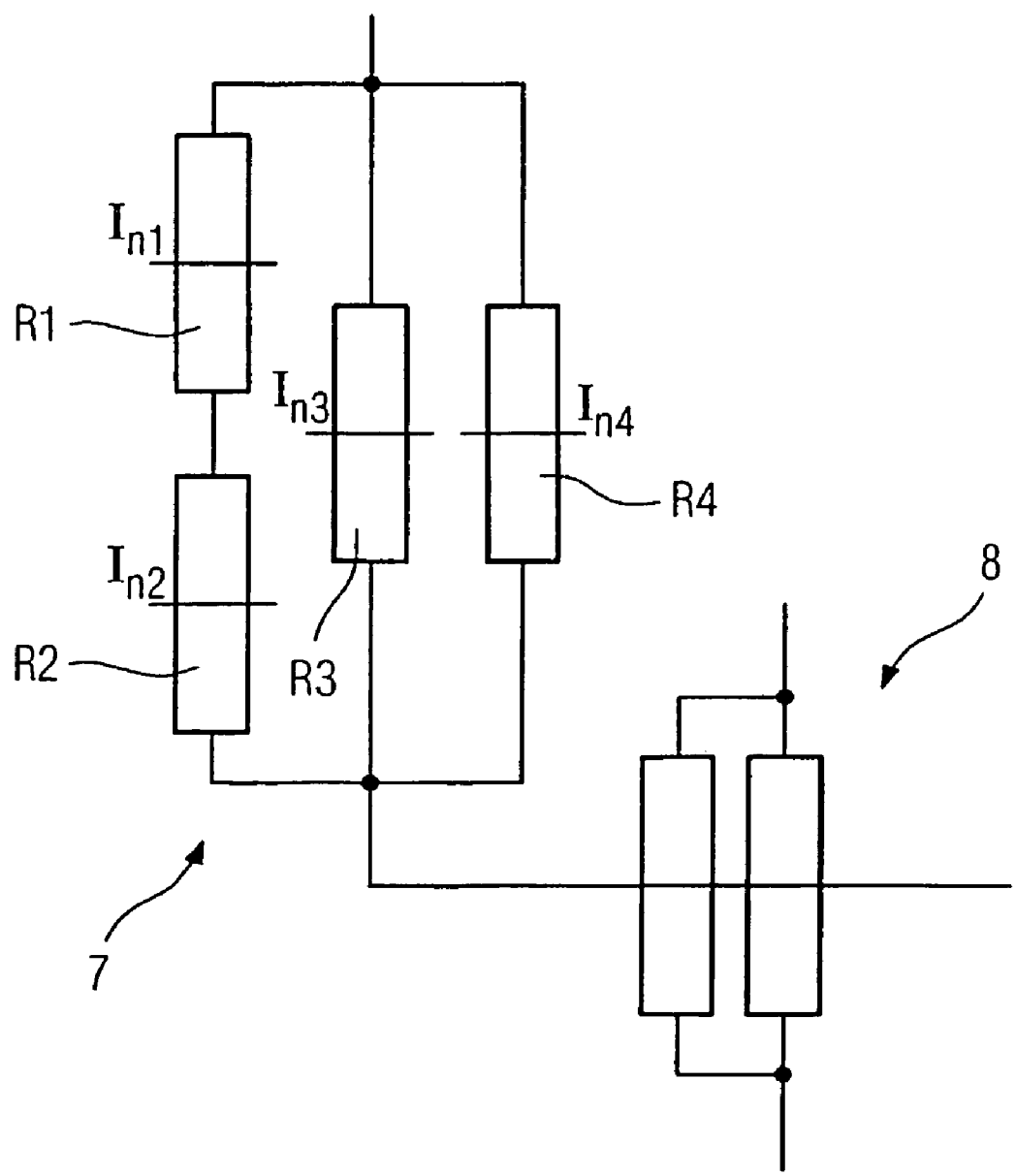
FIG. 4 shows a logic unit according to the invention in which the through-flowing current is processed further as input signal of the next stage.

FIG. 4 shows parts of a logic unit in which the through-flowing current is processed further as input signal of the next stage.

The first logic unit 7 comprises a block of reference or data cells having inputs In1-In4 and resistances $R_1$-$R_4$ which are individually configurable and function cells 8 of a second logic unit. The output of the cells 7 serves as input signal for the function cells 8. In the case of layered cells, the through-flowing current may also be passed into overlying or underlying functional layers. In this way, it is possible to realize larger logic circuits comprising two-value, three-value and higher-value logic.

The invention claimed is:

1. A reconfigurable digital logic unit comprising at least one logic gate with cells which have a magnetic layer system and the resistance of which can be altered by magnetic field pulses, which logic gate comprises a first line branch with at least two data cells connected in parallel and a second line branch, connected in parallel therewith, with at least one reference cell, and also circuitry for evaluating the resistances of the first and second line branches, said resistances representing a measure of the logic state of the logic gate, wherein respective ends of the first and second line branches are connected at a common contact point.

2. The reconfigurable digital logic unit as claimed in claim 1, wherein the circuitry for evaluating the resistances of the first and second line branches is formed as a comparator.

3. The reconfigurable digital logic unit as claimed in claim 1, wherein the circuitry is formed as a parallel circuit comprising the first and second line branches and the total resistance of the parallel circuit can be evaluated.

4. The reconfigurable digital logic unit as claimed in claim 1, characterized in that the second line branch has at least two reference cells (3) connected in parallel.

5. The reconfigurable digital logic unit as claimed in claim 4, characterized in that the number of cells in the first line branch differs from the number of cells in the second line branch.

6. The reconfigurable digital logic unit as claimed in claim 1, characterized in that the first and second line branches have cells connected in series or in parallel, or both.

7. The reconfigurable digital logic unit as claimed in claim 1, characterized in that the output of a logic gate which preferably has a data cell and a reference cell connected in parallel is connected or can be connected to a further gate in order to drive said further gate.

8. The reconfigurable digital logic unit as claimed in claim 7, characterized in that the cells (7) of the logic gate have the same read current direction.

9. The reconfigurable digital logic unit as claimed in claim 1, characterized in that the resistance of a cell (2, 3) can be altered by up to 60% by means of magnetic field pulses.

10. The reconfigurable digital logic unit as claimed in claim 1, characterized in that, in order to create a three-value logic, the resistances in a line branch approximately match and the resistance change from the low value to the intermediate value lying below the high value of the three-value logic preferably amounts to approximately half of the resistance change from the low value to the high value.

11. The reconfigurable digital logic unit as claimed in claim 10, characterized in that the logic gate comprises the resistance levels high, medium and low.

12. The reconfigurable digital logic unit as claimed in claim 11, characterized in that the logic gate can be used for one of the following gate functions: NOR, NAND, OR, AND.

13. The reconfigurable digital logic unit as claimed in claim 10, characterized in that the logic gate can be used for one of the following gate functions: NOR, NAND, OR, AND, const.

14. The reconfigurable digital logic unit as claimed in claim 1, characterized in that, in order to create a four-value logic, the resistance of the first line branch approximately corresponds to 5/3 of the resistance of the second line branch.

15. The reconfigurable digital logic unit as claimed in claim 14, characterized in that the logic gate comprises the resistance levels high, medium-high, medium-low and low.

16. The reconfigurable digital logic unit as claimed in claim 14, characterized in that the logic gate can be used for one of the following gate functions: OR, AND, NOR, NAND.

17. The reconfigurable digital logic unit as claimed in claim 1, characterized in that the logic unit comprises logic gates in two-value and/or three-value and/or four-value logic.

18. The reconfigurable digital logic unit as claimed in claim 1, characterized in that the logic unit is formed as a field-programmable logic unit.

19. The reconfigurable digital logic unit as claimed in claim 1, characterized in that it is formed as a mask-programmable logic unit.

20. The reconfigurable digital logic unit as claimed in claim 1, characterized in that the cells having the magnetic layer system are arranged one alongside another or one above another.

21. A reconfigurable digital logic unit comprising at least one logic gate with cells which have a magnetic layer system and the resistance of which can be altered by magnetic field pulses, which logic gate comprises at least one first line branch with at least one data cell and a second line branch, connected in parallel therewith, with at least one reference cell, and also circuitry for evaluating the resistances of the first and second line branches, said resistances representing a measure of the logic state of the logic gate, wherein the first line branch has at least two data cells (2) connected in parallel and wherein the output of said logic gate is connected or can be connected to a further gate in order to drive said further gate.

* * * * *